United States Patent [19]
Tokutake et al.

[11] Patent Number: 6,132,817
[45] Date of Patent: Oct. 17, 2000

[54] METHOD OF MANUFACTURING PHOTOELECTRIC TRANSDUCER WITH IMPROVED ULTRASONIC AND PURIFICATION STEPS

[75] Inventors: Nobuo Tokutake; Masafumi Sano; Ryo Hayashi, all of Nara; Makoto Higashikawa, Kyoto, all of Japan

[73] Assignee: Canon Kabushiki Kaisha, Tokyo, Japan

[21] Appl. No.: 08/822,607

[22] Filed: Mar. 19, 1997

Related U.S. Application Data

[63] Continuation of application No. 08/364,950, Dec. 28, 1994, abandoned.

[30] Foreign Application Priority Data

Dec. 30, 1993  [JP]  Japan ................................. 5-352623

[51] Int. Cl.$^7$ ................................. B05D 3/10; H05H 1/24
[52] U.S. Cl. ............................ 427/578; 427/74; 427/327; 427/579
[58] Field of Search ............................ 134/1, 1.3, 15, 134/26; 427/74, 327, 328, 578, 579

[56] References Cited

U.S. PATENT DOCUMENTS

| | | | |
|---|---|---|---|
| 2,648,626 | 8/1953 | Buser | 134/15 |
| 3,849,195 | 11/1974 | Powell, Jr. et al. | 134/1 |
| 4,127,738 | 11/1978 | Ghosh et al. | 136/255 |
| 4,251,956 | 2/1981 | Hirata et al. | 51/428 |
| 5,314,780 | 5/1994 | Takei et al. | 430/128 |
| 5,350,457 | 9/1994 | Kitazawa et al. | 134/1 |
| 5,429,685 | 7/1995 | Saito et al. | 136/255 |

FOREIGN PATENT DOCUMENTS

| | | |
|---|---|---|
| 167231 | 1/1986 | European Pat. Off. . |
| 0501498 | 2/1992 | European Pat. Off. . |
| 538840 | 4/1993 | European Pat. Off. . |
| 3283429 | 12/1991 | Japan . |
| 5158257 | 6/1993 | Japan . |

OTHER PUBLICATIONS

Savage, Daniel R "Products Finishing", pp. 40–41, Jan. 1972.
H.U. Pulker, "Coatings on Glass", $2^{nd}$ Ed., pp. 52–55, 1985.
P. Morris, "Industrial Finishing & Surface Coatings" 28(339), Oct. 1976.
Encyclopedia Americana, vol. 27, p. 3536, 1976.
"Bransonic® Ultrasonic Cleaners—Operator's Manual", Bransonic Corp. 1987.
The Encyclopedia Americana, vol. 27, 1978, p. 3536, 1978.

*Primary Examiner*—Fred J. Parker
*Attorney, Agent, or Firm*—Fitzpatrick, Cella, Harper & Scinto

[57] ABSTRACT

A method of manufacturing a photoelectric transducer forms a functional film on a conductive substrate. The method comprises applying ultrasonic cleaning with a cleaning liquid containing water to the conductive substrate, then allowing the surface of the conductive substrate to contact purified water so as to import uniform oxidation and then forming the functional film thereon. The functional film is characterized in being formed with a metal layer as light-reflecting layer, a reflection enhancing layer, and a semiconductor photovoltaic device layer, prepared by a plasma CVD method, comprising a non-monocrystalline material containing silicon atoms as the matrix.

29 Claims, 5 Drawing Sheets

METHOD OF MANUFACTURING PHOTOELECTRIC TRANSDUCER WITH IMPROVED ULTRASONIC AND PURIFICATION STEPS

This application is a continuation of application Ser. No. 08/364,950, filed Dec. 28, 1994, now abandoned.

BACKGROUND OF THE INVENTION

1. Field of the Invention

The present invention relates to a method of manufacturing a photoelectric transducer, more specifically relates to a method of manufacturing a photoelectric transducer which comprises a metal film as, light-reflecting layer on a conductive substrate and, semiconductor thereon comprising a non-monocrystalline material containing silicon atoms as the matrix. In particular, it relates to a method of manufacturing a photoelectric transducer that forms a photovoltaic device in a high yield, and that is uniform and durable for long period use.

2. Related Background Art

Conventionally solar cells, which are photoelectric transducers converting sunlight into electric energy, have been widely used as small power sources for pocket calculators and watches and other consumer goods and are expected to provide future practical technology for a future electric power source that replaces so-called fossil fuels sources.

Such solar cells are based on a technology using the photovoltaic effect of a pn junction and others in the functional parts. Semiconductor materials which constitute the pn junction generally are silicon and germanium. Such semiconductors like silicon absorb sunlight and generate electron and hole photo-carriers, which are caused to drift by the internal electric field of the pn junction to the outside.

While a monocrystal is desirable from the standpoint of efficiency in converting light energy to electromotive force, a crystalline silicon in monocrystalline form has indirect optical ends and its absorption of light is small; thus, it has disadvantages in that a solar cell of monocrystalline silicon has to be of at least 50 microns in thickness for absorbing incident sunlight and in that short wave components are not effectively used because the band gap is about 1.1 eV which is narrower than the 1.5 eV suitable for a solar cell.

Even if a polycrystalline silicon is used for lowering the production cost, the thickness of the solar cell cannot be decreased because the problem of indirect optical ends remains unsolved. Furthermore, a polycrystalline silicon also has other problems like grain boundary. It is generally recognized that a fine crystalline silicon and an amorphous silicon derived material are advantageous which are non-monocrystalline and formed by a chemical vapor deposition (CVD) method for the purpose of making the area large and lowering the cost. While amorphous silicon solar cells, which are made of non-monocrystalline semiconductors and are able to be made into thin films, have been prevalent as small power sources for consumer goods, problems in efficiency and stabilization have to be overcome for their use as electric power cells.

The inventors have studied non-monocrystalline silicon solar cells formed on a conductive substrate and recognized the importance of the conductive substrate and the interface conditions of the metal layer and others formed thereon. Thereby, the inventors have found that poor adherence, the existence of impurity, and a poor junction lower the conversion efficiency of the solar cell and bring deterioration of the reliability, durability and production yield. This means the cleaning method of the conductive substrate is very important, however, the conventional cleaning method of the substrate has been tried to be improved only by the use of a solvent or washing with water.

Such conventional methods of substrate cleaning, however, will not result a satisfactory cleaning effect; in particular, the problem, in the area where many layers of various thin films are laminated on a conductive substrate, is the difficulty of satisfying the characteristics of the photoelectric transducer while providing uniform film quality and attaining stable and constant production in a high yield of high quality deposited films durable for long period use.

The photoelectric transducer, manufactured by a method that comprises forming, on a conductive substrate, a metal layer as a light-reflecting layer, a reflection enhancing layer thereon, and a semiconductor photovolatic layer comprising a non-monocrystalline material containing silicon atom as the matrix by a plasma CVD method, has layers of relatively thin films; its manufacturing method comprises many steps where the temperature is relatively high. Therefore, the adhesion between the conductive substrate and the metal layer formed thereon, the presence of impurities, and the conditions of the junction are very important for improving the conversion efficiency of the photoelectric transducer, its reliability, and the manufacturing yield.

It is therefore strongly desired to develop a method of manufacturing a photoelectric transducer comprising a cleaning step of the substrate whereby the interface between the conductive substrate and metal layer becomes clean.

SUMMARY OF THE INVENTION

An object of the present invention is to provide a manufacturing method whereby photoelectric transducers having a high conversion efficiency and long life durability for use for a long period are manufactured constantly, stably, and in a high yield by overcoming the problems as mentioned above associated with conventional manufacturing methods of photoelectric transducers.

Another object of the present invention is to provide a manufacturing method whereby photoelectric transducers of high durability including moisture resistance are manufactured constantly, stably, and in a high yield.

Another object of the present invention is to provide a manufacturing method whereby photoelectric transducers of high reliability in resisting deformation such as deformation of the substrate are manufactured constantly, stably, and in a high yield.

Another object of the present invention is to provide a manufacturing method of photoelectric transducers, of excellent uniformity, being able to be incorporated into a large area.

Another object of the present invention is to provide an environment-friendly manufacturing method of photoelectric transducers wherein organic solvents are not used.

Another object of the present invention is to provide a manufacturing method of photoelectric transducers excellent in mass continuous production at low cost.

The method of manufacturing a photoelectric transducer according to the present invention is to manufacture a photoelectric transducer in which a functional film is formed on a conductive substrate which comprises applying ultrasonic cleaning with a cleaning liquid containing water to the conductive substrate surface, thereafter allowing the surface of the conductive substrate to contact with purified water, and followed by forming the functional film.

The functional film is characterized in being formed by a metal layer as light-reflecting layer, a reflection enhancing layer, and a semiconductor photovolatic layer, formed by a plasma CVD method, comprising a non-monocrystalline material containing silicon atoms as the matrix.

DETAILED DESCRIPTION OF THE PREFERRED EMBODIMENT

Figure 1:
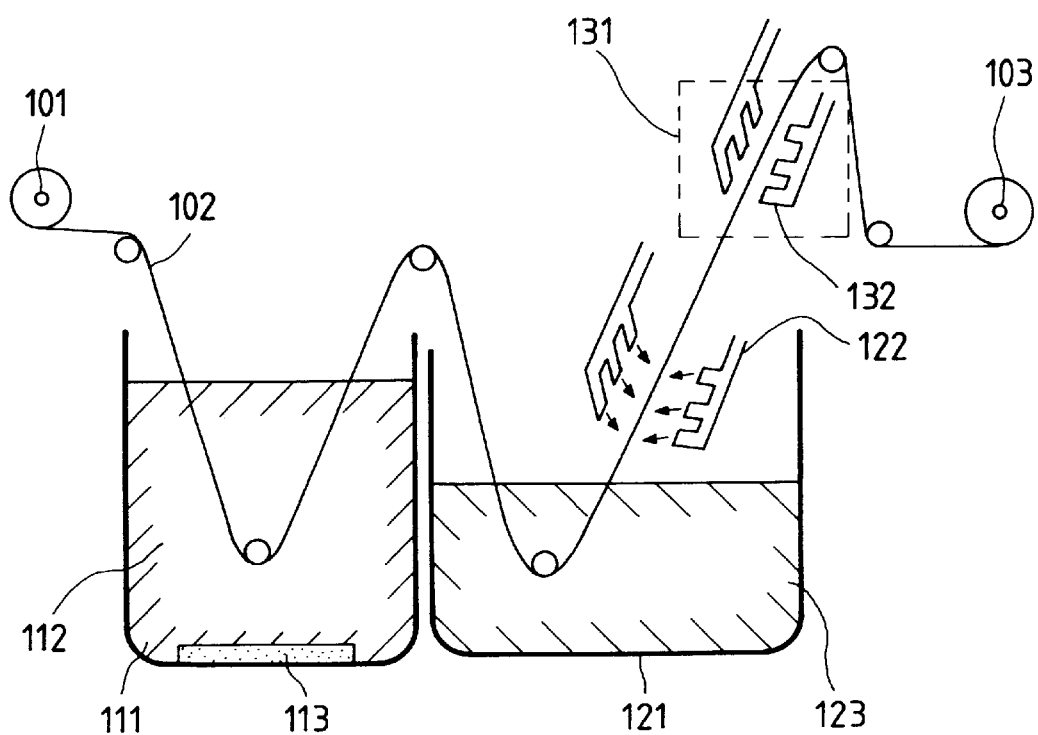
FIG. 1 is a schematic cross-sectional view illustrating a cleaning step of a conductive substrate in the method of manufacturing a photoelectric transducer according to the present invention.

Now, the function of the present invention is explained with reference to the illustrated embodiments.

The inventors have noted the possibility of improving the conversion efficiency, reliability, and yield by means of some treatment to the substrate surface prior to the formation of a metal layer as a light-reflecting layer on a conductive substrate; a concentrated study in this regard has led to completion of the present invention. While the mechanism of the present invention is not clear, the inventors understand at present as follows. First, impurities and fine particles remaining on a conductive substrate cause poor adhesion, defects due to insufficient coverage, increase of resistance in series, poor yield, and peeling off of the films in a continuous use. Too many impurities and fine particles cause significant lowering of conversion efficiency, reliability and yield, which is a conspicuous and important problem in the photoelectric transducer in the constituents of the present invention.

A combination of solvents having high cleaning capability is required above all when a cleaning method, conventionally frequently used, using solvents is applied to a conductive substrate. This method is not practical, however, in consideration of the purity and amount of the solvents employed and economy since there are many problems such as adhesion of fine particles of micron and submicron size, repeated adhesion of impurities, and local adhesion of fine particles and impurities due to the short drying period of the solvents in general.

According to the present invention, the effect of the ultrasonic cleaning is conveyed easily first of all. The cleaning liquid containing water, which has a high dispersion ability, is used in the ultrasonic cleaning removing impurities adhered to the conductive substrate effectively. When the adhered impurities are metallic powder or the like, water is enough for the cleaning liquid. When the adhered impurities include oil and fat, a preferable cleaning liquid contains a surfactant added to water. The conductive substrate subjected to the ultrasonic cleaning is sent without being dried to a contact step with purified water, wherein the impurities rarely adhere repeatedly; the contact is effectively made to purified, high resistivity water almost free of fine particles wherein the impurities including the surfactant are removed. In this way, the surface of the conductive substrate is in good condition for the photoelectric transducer composed of the constituents according to the present invention.

Second, the combination of the step of applying ultrasonic cleaning with a cleaning liquid containing water to the conductive substrate surface and the step of allowing the cleaned surface of the conductive substrate to contact with purified water places the grain boundary condition in the surface of conductive substrate in good condition for the photoelectric transducer composed of the constituents according to the present invention. Conventionally, thin etching has been applied to a conductive substrate surface by use of an acid; however, this etching is not suitable for the photoelectric transducer in the constituents according to the present invention since the grain boundary condition becomes excessively coarse. According to the present invention, the effect of the ultrasonic wave in the cleaning step and the effect of the water pressure in the purified water contact step mainly place the substrate surface in good condition; thereby adhesion between the conductive substrate and the metal layer is improved and the resistance in series becomes lowered.

Third, the combination of the step of applying ultrasonic cleaning with a cleaning liquid containing water to the conductive substrate surface and the step of allowing the cleaned surface of the conductive substrate to contact with purified water makes the oxidation condition of the conductive substrate surface uniform. Thereby, the adhesion becomes uniform and resistant to some deformation of the substrate and the junction conditions hardly change with elapse of time, giving excellent durability and reliance. The existence of an oxide film may theoretically increase the resistance in series; however, it does not cause practical problems according to the present invention since the formed oxide film is extremely thin.

By a synergistic effect of the above factors the, junction between the conductive substrate and the metal layer realized according to the present invention has excellent and uniform adhesion and the junction condition free of change with time even when integrated in a large area. This makes it possible to make respective layers thinner and to form layers at elevated temperatures. Thus, according to the present invention it is possible to manufacture a photoelectric transducer stably, constantly and in a high yield that has a high conversion efficiency, long service life, high humidity resistance, reliable resistance to the substrate deformation, and other excellent quality characteristics.

An organic solvent is not used in the manufacturing method; therefore environment-friendly and low cost manufacture is possible. Furthermore, the excellent effects are easily kept for a large volume and continuous treatment by the cleaning function which contains water and has high dispersion capability.

The cleaning liquid used in the cleaning step of the present invention is preferably water or water containing a surfactant as the cleaning liquid containing water.

While any water quality is acceptable as the cleaning water to which a surfactant is added, most preferable water is purified water of semiconductor grade. More specifically, water having resistivity at 25° C. of at least 1 MΩ·cm, preferably 5 MΩ·cm or higher, and most preferably 10 MΩ·cm or higher is suitable for the purpose of the present invention. The upper limit of the resistivity may be any value up to the theoretical resistivity of 18.25 MΩ·cm, however, 18.2 MΩ·cm or lower, preferably 18.0 MΩ·cm or lower, and most preferably 17.8 MΩ·cm or lower is suitable for the purpose of the present invention in view of cost and productivity. Amount of the fine particles of 0.2 µm size or larger in the water pertinent to the present invention is 10000 per milliliter or less, preferably 1000 per milliliter or less, and most preferably 100 per milliliter or less. Microbes in the water pertinent to the present invention is 100 per milliliter or less, preferably 10 per milliliter or less, and most preferably 1 per milliliter or less.

Activated carbon, distillation, ion-exchange, filtration with filter, reverse osmosis, and ultraviolet sterilization are applicable for getting the cleaning liquid containing water mentioned above; combination of a plurality of these methods are preferred to improve the water quality to the required level.

Too low water temperature will not give satisfactory cleaning effect and the effects of the present invention are not realized fully. The water temperature for the present invention purpose is 10° C. to 90° C., preferably 20° C. to 75° C., and most preferably 30° C. to 55° C.

The surfactant employed in the cleaning step of the present invention may be any one of anionic, nonionic, amphoteric or a mixture thereof; an additive such as sodium tripolyphosphate may be added therein.

Employment of ultrasonic waves in the cleaning step of the present invention is especially important for attaining the effect of the present invention. A magnetostrictive piezoelectric transducer such as of ferrite is used as the ultrasonic wave generator. Ways to introduce ultrasonic wave may be to place such into liquid in the cleaning bath, to adhere the piezoelectric transducer to the bottom or wall surface of the bath, and to transmit the ultrasonic wave to the bath by means of horn from a piezoelectric transducer installed nearby. Use of a plurality of piezoelectric transducers is effective for one cleaning bath is effective in adjustment of the output and uniformilization of the cleaning effect. Relatively low frequency ultrasonic wave, of strong cavitation, has been conventionally used because of the large cleaning effect, however, such low frequency is not preferred in the present invention since the substrate is physically damaged. On the other hand, relatively high frequency is not practical in the present invention since the cleaning effect is low. More specifically, pertinent frequency in the present invention is 10 kHz to 10 MHz, preferably 35 kHz to 5 MHz, and most preferably 50 kHz to 1 MHz. Pertinent output of the ultrasonic wave is preferably 0.1 W/liter to 500 W/liter, and more preferably 1 W/liter to 100 W/liter.

The quality of the water used in the purified water contact step according to the present invention is very important and is preferably of super purified water of semiconductor grade, especially preferably of very large scale integration (LSI) grade. More specifically, water having resistivity at 25° C. of at least 11 MΩ·cm, preferably 13 MΩ·cm or higher, and most preferably 15 MΩ·cm or higher is suitable for the purpose of the present invention. The upper limit of the resistivity may be any value up to the theoretical resistivity of 18.25 MΩ·cm, however, 18.2 MΩ·cm or lower, preferably 18.0 MΩ·cm or lower, and most preferably 17.8 MΩ·cm or lower is suitable for the purpose of the present invention in view of cost and productivity. Amount of the fine particles of 0.2 µm size or larger in the water pertinent to the present invention is 10000 per milliliter or less, preferably 1000 per milliliter or less, and most preferably 100 per milliliter or less. Microbes in the water pertinent to the present invention is 100 per milliliter or less, preferably 10 per milliliter or less, and most preferably 1 per milliliter or less. Total organic compounds (TOC) in the water pertinent to the present invention is 10 mg per milliliter or less, preferably 1 mg per milliliter or less, and most preferably 0.2 mg per milliliter or less.

Activated carbon, distillation, ion-exchange, filtration with filter, reverse osmosis, and ultraviolet sterilization are applicable for getting the cleaning liquid containing water mentioned above; combination of a plurality of these methods are preferred to improve the water quality to the required level.

The contact of purified water with the substrate is preferably made with an angle in relation to the substrate surface under pressure. When the angle is large, fouled water may adhere again; when the angle is small, the water pressure by spraying cannot be effective requiring a large amount of purified water with the poor utilization efficiency of the purified water. Thus, the spraying angle in relation to the substrate horizontal surface is 10 to 80 degrees, preferably 20 to 60 degrees, and most preferably 30 to 45 degrees for the purpose of the present invention.

The spray pressure of the purified water gives small effect if too weak, and damaged the substrate physically if too strong; and should be 1 to 300 kgf/cm$^2$, preferably 5 to 200 kgf/cm$^2$, and most preferably 10 to 150 kgf/cm$^2$ for the purpose of the present invention. The pressure unit kgf/cm$^2$ herein means gravity kilogram per square centimeter; 1 kgf/cm$^2$ equals 98066.5 Pa.

Spraying method of the purified water may be nozzle spraying of high pressure purified water boosted by a pump, or nozzle spraying of mixture of high pressure air and pumped purified water under the pressure of air.

The flow rate of purified water pertinent to the present invention in view of the effect of the invention and economy is 1 to 200 liters per minute, preferably 2 to 100 liters per minute, and most preferably 5 to 50 liters per minute.

Too high or too low purified water temperature will not give satisfactory effect of the present invention; pertinent purified water temperature in the present invention is 5° C. to 90° C., preferably 10° C. to 55° C., and most preferably 15° C. to 40° C.

Now, a method of manufacturing a photoelectric transducer according to the present invention is explained in more details referring the attached drawings.

Figure 2:
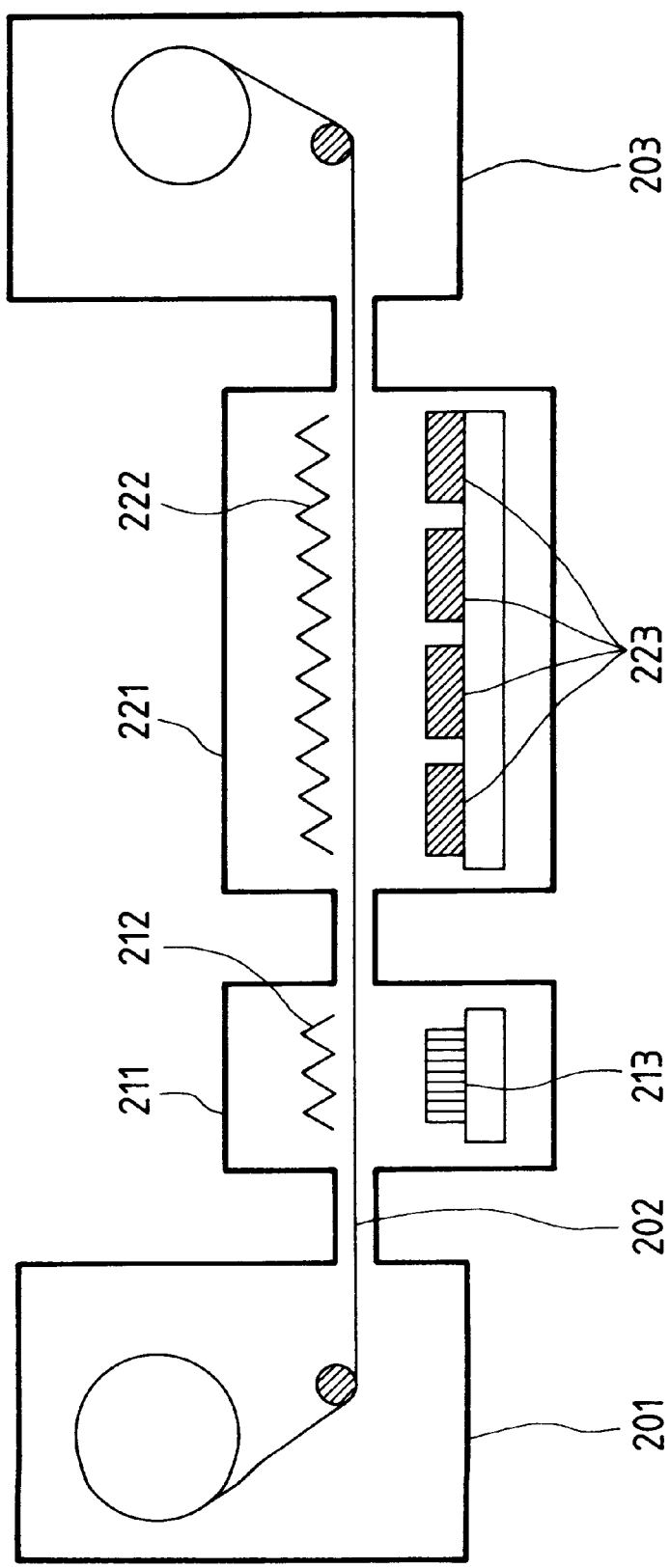
FIG. 2 is a schematic cross-sectional view illustrating a device forming a light-reflecting layer and reflection enhancing layer according to the present invention.
Figure 7A:
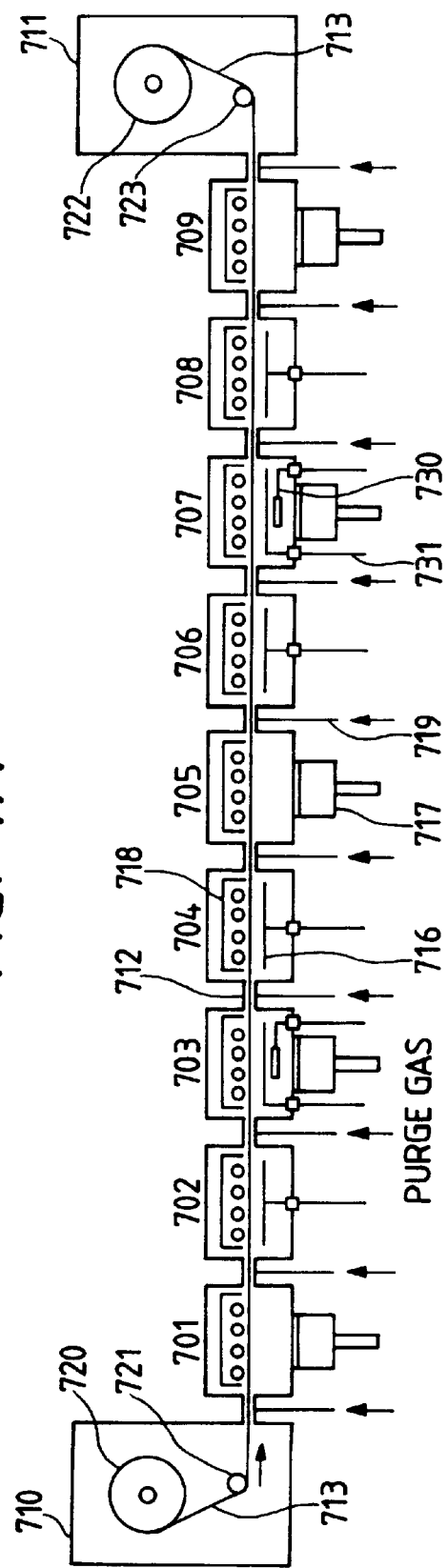
FIGS. 7A and 7B are schematic drawings illustrating an example of a deposition apparatus of a roll-to-roll type.
Figure 7B:
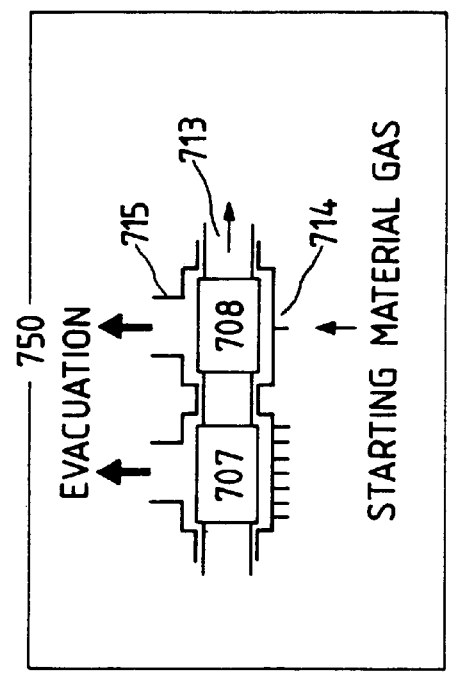

FIG. 1 shows a pretreatment apparatus for cleaning a substrate according to the present invention and FIG. 2 shows a deposited film forming apparatus according to the present invention where a metal or others are deposited on the substrate. FIGS. 7A and 7B show a deposited film forming apparatus where deposited films are formed on the substrate that has been subjected to treatments by the ways shown in FIGS. 1 and 2. In this embodiment, the substrate is a long stainless steel both surfaces of which are mirror polished.

In FIG. 1, a conductive substrate 102 set in a substrate feeding mechanism 101 (wound on a roll for example) is transported continuously or intermittently to a substrate cleaning bath 111 by means of a substrate takeup mechanism 103. Impurities adhered on the substrate surfaces are cleaned in a cleaning liquid (aqueous surfactant solution) 112 by ultrasonic wave (frequency: 60 kHz, output: 400 W, for example) generated by an ultrasonic generator comprising a ferritic piezoelectric transducer 113 connected to an unshown power source.

Then, the conductive substrate 102 is transported to a purified water contacting bath 121, in which purified water is sprayed from nozzles 122 at a pressure of 50 kgf/cm². The purified water is kept at a temperature of 25° C., has a resistivity of 15 MΩ·cm, and contains 100 or less fine particles of 0.2 μm or larger size per milliliter. In the embodiment configuration shown in FIG. 1, the conductive substrate 102 is preliminarily contacted with aqueous solution 123 which is spent pure water and stored in a predetermined volume.

The conductive substrate 102 finishing the purified water contact step is transported to a drying zone 131 where high temperature and high pressure air or the like is blown from nozzles 132 for drying.

The conductive substrate 102 finishing the drying step is wound up by the substrate takeup mechanism 103, and subsequently a metal layer as light-reflecting layer and a reflection enhancing layer are continuously formed thereon by a forming apparatus by a DC magnetron sputtering method as shown in FIG. 2.

The conductive substrate 202 set in a substrate feeding chamber 201 is transported through a metal layer deposition chamber 211 and a reflection enhancing layer deposition chamber 221 to a substrate takeup chamber 203.

The conductive substrate 202 is first transported to the metal layer deposition chamber 211 and heated therein to a desired temperature by a substrate heater 212. The target 213 of the metal layer deposition chamber 211 is Ag of 99.99% purity for example and deposit Ag on the conductive substrate 202 by DC magnetron sputtering.

Then, the conductive substrate 202 is transported to the reflection enhancing layer deposition chamber 221 and heated therein to a desired temperature by a substrate heater 222. The target 223 of the reflection enhancing layer deposition chamber 221 is ZnO of 99.99% purity for example and deposit ZnO layer subsequently by DC magnetron sputtering. In the embodiment shown in FIG. 2, the target 223 consists of four plate shape pieces in view of the deposition speed and desired film thickness. However, a rotatable target in a shape of drum may be employed to deposit continuously and to increase deposition time. In this step, a sheet of protective paper (not shown) may be inserted between the substrates concurrently with the substrate takeup. On the substrate on which a metal layer as light-reflecting layer and a reflection enhancing layer are continuously formed through the cleaning step and purified water contact step, a semiconductor is deposited by a plasma CVD method. FIG. 7 shows how a tandem type solar cell is manufactured comprising non-monocrystalline material containing silicon atom as the matrix by a forming apparatus of photovoltaic layer.

FIGS. 7A and 7B are schematic drawings illustrating a continuous semiconductor layer formation apparatus by a roll-to-roll method.

In this apparatus, a substrate feeding chamber 710, a plurality of deposition chambers 701–709, and a substrate takeup chamber 711 are located in this order. Among them, separation paths 712 are placed for respective connections. A long substrate 713 passes through them moving continuously from the substrate feeding chamber to the substrate takeup chamber; thereby the substrate is transported and respective semiconductor layers are simultaneously formed in each chamber with the transportation. Reference numeral 750 denotes a plan view observing from a top side of the deposition chambers; respective deposition chambers have an inlet 714 for the starting material gas and an outlet 715 for the spent gas; RF electrodes 716 which apply high frequency or direct current voltage or microwave applicators 717 are provided therein as required and halogen lamp heaters 718 are installed internally for heating the substrate. The starting material gas inlets 714 are connected to the starting material gas feeder. Respective deposition chambers have an outlet for the gas and are connected to vacuum evacuation pumps (not shown) such as an oil diffusion pump and mechanical booster pump. Respective RF electrodes are connected to the RF power sources and microwave applicators are connected to the MW power sources.

The deposition chambers 703 and 707 for i-type layer have bias electrodes 731 and target electrodes 730, respectively connected to RF power sources.

The separation paths connected to the deposition chambers have inlets 719 respectively for introducing the purge gas. The substrate feeding chamber is provided with a feeder roll 720 and a guide roll 721 that applies tension properly to the substrate and maintains the substrate horizontally. The substrate takeup chamber is provided with a takeup roll 722 and a guide roll 723.

First, the substrate mentioned above having formed light-reflecting layer and reflection enhancing layer is wound on to the substrate feeding roller 720, set to the substrate feeding chamber, allowed to pass through respective deposition chambers, and wound to the substrate takeup roll 722. The whole apparatus is evacuated into a vacuum by a vacuum pump not shown, the lamp heaters in respective deposition rooms are put into lightning and set so as to make the substrate temperature at respective chambers as predetermined. When the pressure of the whole apparatus becomes 1 m Torr or lower, He gas is introduced through the purge gas inlet 719; and the substrate is moved in the direction of arrow and wound by the takeup roll.

Respective starting gases are introduced into the respective deposition chambers while adjustment of the He gas flow rate into each separation path and pressure of each deposition chamber being made so that the starting materials flowing into each deposition room should not diffuse to other deposition rooms. Then, glow discharge is generated by turning on the RF power, MW power and others; thereby respective semiconductor layers are formed. The notation of RF or MW just before the expression of n (p) type layer hereinafter means the electric power for the plasma generation is RF or MW respectively.

On the substrate, a first MWn-type layer (μc-Si, thickness: 20 nm) is formed in the deposition chamber 701; a first RFn-type layer (a-Si, thickness: 10 nm) in deposition chamber 702; a first i-type layer (a-Si, thickness: 250 nm) in deposition chamber 703; a first RFp-type layer (a-Si, thickness: 10 nm) in deposition chamber 704; a first MWp-type layer (μc-Si, thickness: 10 nm) in deposition chamber 705; a second RFn-type layer (a-SiC, thickness: 20 nm) in deposition chamber 706; a second i-type layer (a-SiC, thickness: 200 nm) in deposition chamber 707; a second RFp-type layer (a-SiC, thickness: 10 nm) in deposition chamber 708; and a second MWp-type layer (μc-Si, thickness: 10 nm) in deposition chamber 709 successively. When the transportation of the substrate finishes, all the MW and RF power sources are turned off stopping the glow discharge and the introduction of the starting material gas and purge gas is stopped. A photoelectric transducer is completed thereby after allowing the whole apparatus to leak, removing the wound substrate, and forming transparent electrodes and collector electrodes.

Now, the elements composing the photoelectric transducer are explained in details.

Conductive Substrate

The conductive substrate may be a conductive material itself or what forms the support of an insulative material or conductive material on which a conduction treatment is applied. Examples of the conductive support include metals such as NiCr, stainless steel, Al, Cr, Mo, Au, Nb, Ta, V, Ti, Pt, Pb and Sn and their alloys. Examples of the insulative support include films or sheets of synthesized resins such as polyester, polyethylene, polycarbonate, cellulose acetate, polypropylene, polyvinyl chloride, polyvinylidene chloride, polystyrene, and polyamide; glass; and ceramics. Preferable insulative supports of them are what are applied with conduction treatment at least on the one surface; the photovoltaic layer is preferably formed on the treated surface.

While the conductive substrate may be of conductive material or what forms the support of an insulative material or conductive material on which a conduction treatment is applied, most noticeable effect develops when the substrate is of a metal to which impurities tend to adhere in the process of the substrate manufacturing and which has a high mechanical strength. Most preferable such conductive substrate is a ferritic stainless steel comprising at least about 18% of Cr or an austenic stainless steel comprising at least about 18% of Cr and 8% of Ni.

Metal Layer

As for the metal layer as light-reflecting layer that has a high conductivity, metals having a high reflectance for from visible light to near-infrared light such as Ag, Al, Cu and AlSi are pertinent. These metals are suitably formed by vacuum vapor deposition by resistance heat, vacuum vapor deposition by electron beam, joint vapor deposition, and sputtering. Preferable layer thickness of the metal as light-reflecting layer is 10 to 5000 nm. For the purpose of making these metals into texture (concave and convex) surface structure, the substrate temperature is made 200° C. or higher when deposited.

While the thickness of the metal as light-reflecting layer is effective in the range of 10 to 5000 nm, the effect is more conspicuous in the range of 30 to 3000 nm; 50 to 1000 nm will bring best effect.

Reflection Enhancing Layer

As the reflection enhancing layer which transmits light, ZnO, $SnO_2$, $In_2O_3$, ITO, $TiO_2$, CdO, $Cd_2SnO_4$, $Bi_2O_3$, $MoO_3$, and $Na_xWO_3$ are suitable. Most suitable one for the purpose of the present invention is of ZnO that is highly resistant to plasma and durable to severe conditions.

Deposition method suitable for the reflection enhancing layer may be vacuum vapor deposition, sputtering, CVD, spraying, spinning on or dipping.

While suitable thickness of the reflection enhancing layer varies depending on the refractive index of the material, preferable range of the layer thickness is 50 nm to 10 $\mu$m. For the purpose of making the reflection enhancing layer into texture surface structure, the substrate temperature during the deposition is preferred to elevate to 300° C. or higher or application of partial etching is preferred.

While the layer thickness of the reflection enhancing layer is effective in the range of 50 nm to 10 $\mu$m, the effect is more conspicuous in the range of 100 nm to 5 $\mu$m; 200 nm to 2 $\mu$m will bring best effect.

Semiconductor Photovoltaic Layer (i) Layer Having p- or n-type Conductivity (referred to as p-type layer and n-type layer hereinafter)

The p-type layer or n-type layer is important layer determining characteristics of photovoltaic device.

Examples of amorphous material (represented by a-) (a microcrystalline material (shown as $\mu$c-) is also included in the category of amorphous material in the present invention of the p-type layer or n-type layer are materials in which a p-type valence electron controlling agent (the periodic table Group III atom: B, Al, Ga, In, Tl) or n-type valence electron controlling agent (the periodic table Group V atom: P, As, Sb, Bi) in a high concentration is added to, for example, a-Si:H, a-Si:HX (X is a halogen atom), a-SiC:H, a-SiC:HX, a-SiGe:H, a-SiGeC:H, a-SiO:H, a-SiN:H, a-SiON:HX, a-SiOCN:HX, $\mu$c-Si:H, $\mu$c-SiC:H, $\mu$c-Si:HX, $\mu$c-SiC:HX, $\mu$c-SiGe:H, $\mu$c-SiO:H, $\mu$c-SiGeC:H, $\mu$c-SiN:H, $\mu$c-SiON:HX, and $\mu$c-SiOCN:HX.

Examples of polycrystalline material (represented by poly-) are materials in which a p-type valence electron controlling agent (the periodic table Group III atom: B, Al, Ga, In, Tl) or n-type valence electron controlling agent (the periodic table Group V atom: P, As, Sb, Bi) in a high concentration is added to, for example, poly-Si:H, poly-Si:HX, poly-SiC:H, poly-SiC:HX, poly-SiGe:H, poly-Si, poly-SiC, and poly-SiGe.

A crystalline semiconductor layer which absorbs light little or an amorphous semiconductor which has a wide band gap is suitable for a p-type layer or n-type layer, especially for the incident light side.

The most suitable amount of addition of the periodic table Group III atom to a p-type layer and most suitable amount of addition of the periodic table Group V atom to a n-type layer is 0.1–50 at. %.

Hydrogen atom (H, D) or a halogen atom contained in a p-type or n-type layer functions to compensate uncoupled valence of a p-type or n-type layer and improves doping efficiency of the p-type or n-type layer. Most suitable amount of addition of hydrogen atom or a halogen atom to a p-type or n-type layer is 0.1–40 at. %. In particular, when the p-type or n-type layer is crystalline, most suitable amount of addition of hydrogen atom or a halogen atom is 0.1–8 at. %. Furthermore, preferable distribution is that higher content of hydrogen atom and/or a halogen atom is distributed at each interface of p-type layer/i-type layer and n-type layer/i-type layer, and preferable range is that the contents of hydrogen atom and/or a halogen atom in the periphery of such interface is 1.1 to 2 times the contents within the whole bulk. By increasing concentration of hydrogen atom or a halogen atom in the periphery of each interface of p-type layer/i-type layer and n-type layer/i-type layer, it becomes possible that defect level and mechanical strain in the periphery of such interface are decreased and that the photovoltaic power and photoelectric current of photovoltaic device are increased.

Activation energy of not higher than 0.2 eV is preferable, not higher than 0.1 eV being most suitable, as the electric characteristics of p-type layer and n-type layer of a photovoltaic device. Specific resistance of not higher than 100 $\Omega$cm is preferable, not higher than 1 $\Omega$cm being most suitable. Furthermore, layer thickness of 1–50 nm is preferable, 3–10 nm being most suitable, as a p-type and n-type layer.

As a starting material gas suitable for deposition of a p-type or n-type layer of photovoltaic device, gasifiable compounds containing silicon atom, gasifiable compounds containing germanium atom, gasifiable compounds containing carbon atom and mixed gas of these compounds may be used.

Examples of gasifiable compounds containing silicon atoms include, $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, and $Si_2D_3H_3$.

Examples of gasifiable compounds containing germanium atoms include $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

Examples of gasifiable compounds containing carbon atoms includes $CH_4$, $CD_4$, $C_nH_{2n+2}$ (n: integer), $C_nH_{2n}$ (n: integer), $C_2H_2$, $C_6H_6$, $CO_2$, and CO.

The materials to be introduced into a p-type or n-type layer for controlling valence electron may be a periodic table Group III atom and a periodic table Group V atom.

Materials to be used effectively as the starting material of a Group III atom introduction include boron hydride such as $B_2H_6$, $B_4H_9$, $B_5H_9$, $B_6H_{10}$, $B_6H_{10}$, $B_6H_{12}$, and $B_6H_{14}$ and boron halide such as $BF_3$ and $BCl_3$ for boron atom introduction. In addition, $AlCl_3$, $GaCl_3$, $InCl_3$, and $TlCl_3$ can also be used. In particular, $B_2H_6$ and $BF_3$ are suitable.

Materials to be used effectively as the starting material of a Group IV atom introduction include phosphorus hydride such as $PH_3$ and $P_2H_4$, and phosphorus halide such as $PH_4I$, $PF_3$, $PF_5$, $PCl_3$, $PCl_5$, $PBr_3$, $PBr_5$, and $PI_3$ for a halogen atom introduction. In addition, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ can also be used. In particular, $PH_3$ and $PF_3$ are suitable.

Gasifiable compounds mentioned above may appropriately be diluted by gas such as $H_2$, He, Ne, Ar, Xe, and Kr before introduction into deposit chamber.

A method of depositing p-type or n-type layer suitable for a photovoltaic device is an RF plasma CVD method and a microwave plasma CVD method.

In the case of deposition by an RF plasma CVD method, volume coupling type RF plasma CVD method is suitable. In the case of depositing p-type or n-type layer by an RF plasma CVD method, 100–350° C. substrate temperature inside the deposit chamber, 0.1–10 Torr internal pressure, 0.01–5.0 W/cm² RF power and 0.1–30 Å/sec deposition rate are most suitable conditions.

In particular, in the case of depositing layer absorbing little light such as microcrystalline semiconductor and a-SiC:H, or layer with a wide band gap, it is preferable to dilute the starting material gas by 2–100 times using hydrogen gas and also to introduce comparatively higher RF power. As the frequency of RF, 1 MHz–100 MHz range is suitable, and frequency especially in the periphery of 13.56 MHz is most suitable.

In the case of depositing a p-type or n-type layer by a microwave plasma CVD method, microwave plasma CVD apparatus guiding microwaves into the deposit chamber through a dielectric window (alumina ceramics, etc.) is suitable.

In the case of depositing p-type or n-type layer by a microwave plasma CVD method, 100–450° C. substrate temperature inside the deposit chamber, 0.5–30 m Torr internal pressure, 0.01–1 W/cm³ microwave power and 0.5–10 GHz microwave frequency are preferable range.

In particular, in the case of depositing layer absorbing little light such as microcrystalline semiconductor and a-SiC:H, or layer with a wide band gap, it is preferable to dilute the starting material gas by 2–100 times using hydrogen gas and also to introduce comparatively higher microwave power.

i-type Layer

The i-type layer of a photovoltaic device is an important layer generating and transporting carrier for irradiation light. Slightly p-type layer or slightly n-type layer may be also used as an i-type layer.

Examples of amorphous material (represented by a-) (microcrystalline material (shown as μc-) is also included in the category of amorphous material in the present invention) of i-type layer are materials such as a-Si:H, a-Si:HX (X is a halogen atom), a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-Si:HX, μc-SiC:HX, μc-SiGe:H, μc-SiO:H, μc-SiGeC:H, μc-SiN:H, μc-SiON:HX, and μc-SiOCN:HX.

Examples of polycrystalline material (represented by poly-) are materials such as poly-Si:H, poly-Si:HX, poly-SiC:H, poly-SiC:HX, poly-SiGe:H, poly-Si, poly-SiC, and poly-SiGe.

A hydrogen atom (H, D) or a halogen atom (X) contained in i-type layer functions to compensate uncoupled valence of i-type layer and improve the product of the mobility and the life of carrier in an i-type layer. They also compensate interface level of each interface of p-type layer/i-type layer and n-type layer/i-type layer and have effect on improvement of photovoltaic power, photocurrent and response to light of photovoltaic device. As most suitable concentration of hydrogen atom and/or a halogen atom contained in i-type layer, 1–40 at. % are recommended.

In particular, it is recommended as preferable distribution that more contents of hydrogen atoms and/or a halogen atom are distributed at each interface side of p-type layer/i-type layer and i-type layer/n-type layer, and it is recommended as preferable range that the contents of hydrogen atoms and/or a halogen atom in the periphery of such interface lie in 1.1–2 time range of the contents within the whole bulk.

Layer thickness of 0.05–1.0 μm is most suitable as thickness of an i-type layer, although it greatly depends on structure of photovoltaic device (such as single cell, tandem cell and triple cell) and band gap of i-type layer.

As starting material gas suitable for deposition of an i-type layer of photovoltaic device, gasifiable compounds containing silicon atoms, gasifiable compounds containing germanium atoms, gasifiable compounds containing carbon atoms and mixed gas of these compounds may be used.

Examples of gasifiable compounds containing silicon atoms include $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, and $Si_2D_3H_3$.

Examples of gasifiable compounds containing germanium atoms include $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

Examples of gasifiable compounds containing carbon atoms include $CH_4$, $CD_4$, $C_nH_{2n+2}$ (n: integer), $C_nH_{2n}$ (n: integer), $C_2H_2$, $C_6H_6$, $CO_2$, and CO.

Gasifiable compounds mentioned above may appropriately be diluted by gas such as $H_2$, He, Ne, Ar, Xe, and Kr before introduction into the deposit chamber.

Method of depositing an i-type layer suitable for photovoltaic device is an RF plasma CVD method and microwave plasma CVD method.

In the case of deposition by an RF plasma CVD method, volume coupling type RF plasma CVD method is suitable. In the case of depositing an i-type layer by an RF plasma CVD method, 100–350° C. substrate temperature inside the deposit chamber, 0.1–10 Torr internal pressure, 0.01–5.0 W/cm² RF power and 0.1–30 Å/sec deposition rate are most suitable conditions.

In particular, in the case of depositing layer absorbing little light such as microcrystalline semiconductor and a-SiC:H or layer with a wide band gap, it is preferable to dilute starting material gas by 2–100 times using hydrogen gas and also to introduce comparatively higher power. As the frequency of RF, 1 MHz–100 MHz range is suitable, and the frequency especially in the periphery of 13.56 MHz is most suitable.

In the case of depositing an i-type layer by microwave plasma CVD method, microwave plasma CVD apparatus guiding microwave into the deposit chamber through a dielectric window (alumina ceramics, etc.) is suitable.

In the case of depositing i-type layer by microwave plasma CVD method, 100–450° C. substrate temperature inside deposit chamber, 0.5–30 m Torr internal pressure, 0.01–1 W/cm$^3$ microwave power and 0.5–10 GHz microwave frequency are preferable range.

In particular, in the case of depositing layer absorbing less light such as microcrystalline semiconductor and a-SiC:H or layer with a wide band gap, it is preferable to dilute starting material gas by 2–100 times using hydrogen gas and also to introduce comparatively higher microwave power.

Following is a detailed explanation of experiment done to demonstrate effect of the present invention.

Experiment 1

Figure 3:
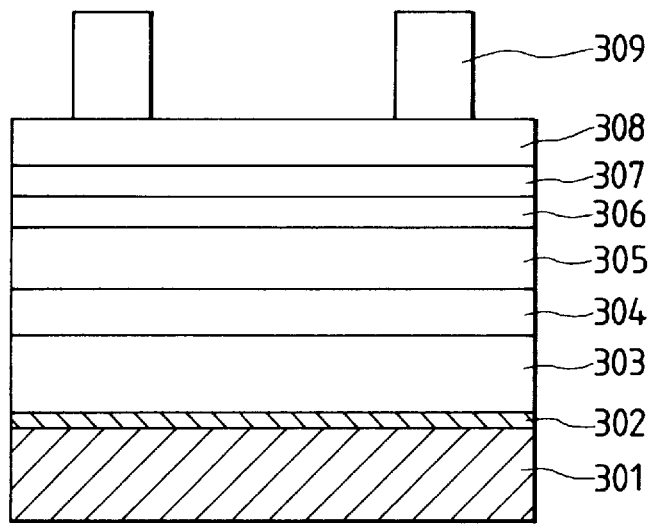
FIG. 3 is a schematic cross-sectional view illustrating the constitution of a photoelectric transducer.

Surface pretreatment of stainless steel substrate (SUS 304) with 0.5 mm thickness and 50×50 mm$^2$ area was made under the conditions shown in Table 1. In this Experiment 1, however, 1 wt % aqueous solution of polyethylene glycol nonylphenyl ether was used as the surfactant. A solar cell was produced on this substrate. The solar cell of FIG. 3 was produced by using equipment shown in FIG. 4. FIG. 3 shows that light-reflecting layer 302, reflection enhancing layer 303, n-type layer (p-type layer) 304, i-type layer 305, RFp-type layer (n-type layer) 306, MWp-type layer (n-type layer) 307, transparent electrode 308 and current collector electrode 309 are positioned in this order on substrate 301. Formation of n-type layer was made by RF PCVD method.

By using sputtering method, Ag light-reflecting layer 302 of 0.3 μm thickness on the surface of stainless steel substrate 301 was formed at room temperature and ZnO reflection enhancing layer 303 of 1.0 μm thickness was formed on the Ag light-reflecting layer 302 at 350° C.

Figure 4:
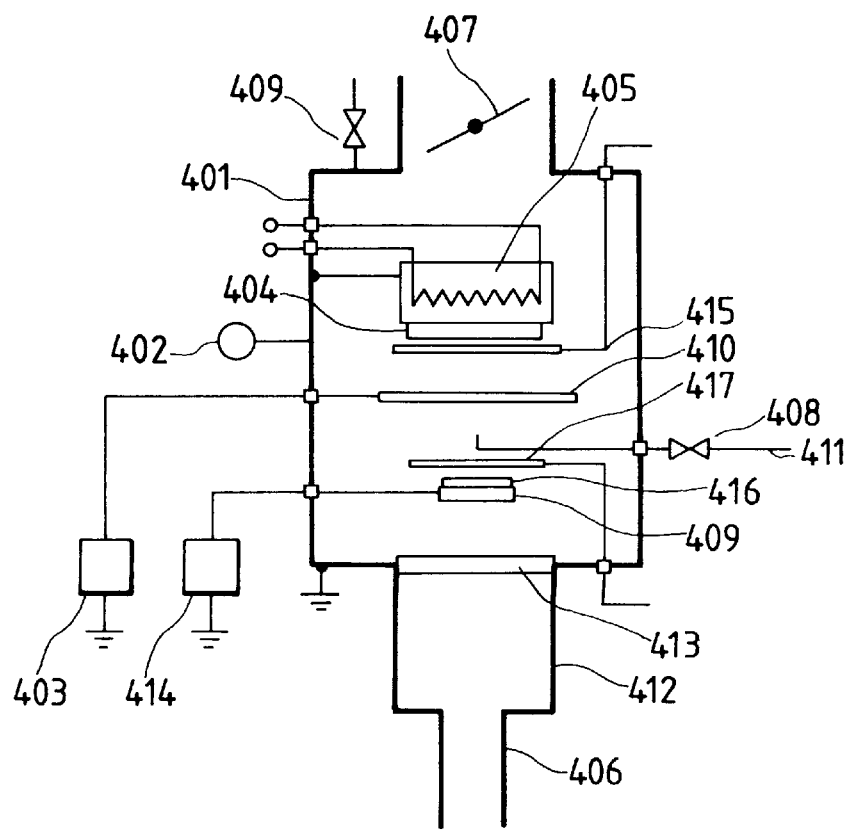
FIG. 4 is a schematic cross-sectional view illustrating an example of plasma CVD apparatus.

Then each semiconductor layer was formed on the reflection enhancing layer by using deposition apparatus shown in FIG. 4 which could do both MW PCVD method and RF PCVD method.

This deposition apparatus is connected to the starting material gas supply system (not shown), through starting material gas inlet pipe. In FIG. 4, reference numeral 401 represents deposit chamber, reference numeral 402 represents vacuum gauge, reference numeral 403 represents bias power supply, reference numeral 404 represents substrate, reference numeral 405 represents heater, reference numeral 406 represents waveguide, reference numeral 407 represents conductance valve, reference numeral 408 represents auxiliary valve, reference numeral 409 represents leak valve, reference numeral 410 represents bias electrode, reference numeral 411 represents starting material gas inlet pipe, reference numeral 412 represents applicator, reference numeral 413 represents dielectric window, reference numeral 414 represents target power source, reference numeral 415 represents shutter, reference numeral 416 represents target and reference numeral 417 represents target shutter. Starting material gas inlet pipe is connected to starting material gas cylinders made of ultra high purity metal such as SiH$_4$ gas cylinder, SiF$_4$ gas cylinder, CH$_4$ gas cylinder, GeH$_4$ gas cylinder, GeF$_4$ gas cylinder, S$_n$H$_4$ gas cylinder, PH$_3$/H$_2$ (dilution: 100 ppm) gas cylinder, B$_2$H$_6$/H$_2$ (dilution to: 100 ppm) gas cylinder and H$_2$ gas cylinder.

Then the bottom surface of substrate 404 on which light-reflecting layer and reflection enhancing layer were formed was contacted closely to heater 405, leak valve 409 of deposit chamber 401 was closed, conductance valve 407 was fully opened and vacuum exhaust pump (not shown) was operated until pressure inside deposit chamber 401 dropped to about 1×10$^{-5}$ Torr.

After preparation for film formation was completed as described above, RFn-type layer 304 comprising μc-Si, i-type layer 305 comprising a-SiC, RFp-type layer 306 comprising a-SiC and MWp-type layer 307 comprising μc-SiC were formed in this order on substrate 404.

Before formation of RFn-type layer comprising μc-Si, H$_2$ gas was introduced into deposit chamber 401, mass flow controller was adjusted so that flow rate might become 300 sccm and conductance valve was adjusted so that pressure inside deposit chamber might become 1.0 Torr. Heater 405 was set to make temperature of substrate 404 350° C. and then SiH$_4$ gas and PH$_3$/H$_2$ gas were flowed into deposit chamber 401 after confirmation of substrate temperature stability. At this point of time, adjustment was made to obtain 2 sccm flow rate for SiH$_4$ gas, 100 sccm flow rate for H$_2$ gas, 200 sccm flow rate for PH$_3$/H$_2$ gas and 1.0 Torr for internal pressure inside deposit chamber. Power of RF power supply was set at 0.02 W/cm$^3$ to introduce RF power to bias electrode 410, generate glow discharge, open shutter 415, start formation of RFn-type layer on substrate 404, close shutter after confirmation of 20 nm layer thickness of RFn-type layer deposited, stop glow discharge by switching RF power supply off and thus complete formation of RFn-type layer. Flow of SiH$_4$ gas and PH$_3$/H$_2$ gas into deposit chamber was stopped but flow of H$_2$ gas into deposit chamber was continued for 5 minutes. And then flow of H$_2$ gas into deposit chamber was also stopped for vacuum exhaust to obtain 1×10$^{-5}$ Torr in deposit chamber and gas pipes.

Next, i-type layer comprising a-SiC was formed by MW PCVD method. First, introduction of 300 sccm H$_2$ gas was done to obtain 0.01 Torr pressure and 350° C. temperature of substrate 404. After confirmation of substrate temperature stability, adjustment was made to obtain 150 sccm flow rate for SiH$_4$ gas, 30 sccm flow rate for CH$_4$ gas, 150 sccm flow rate for H$_2$ gas and 0.01 Torr for internal pressure of deposit chamber 401. Then power of RF power supply was set at 0.32 W/cm$^3$ to be applied to bias electrode 410. And then power of MW power supply (not shown) was set at 0.20 W/cm$^3$ to introduce MW power into deposit chamber through dielectric window 413 for generation of glow discharge.

Furthermore, before formation of RFp-type layer comprising a-SiC, H$_2$ gas was introduced into deposit chamber 401, mass flow controller was adjusted so that flow rate might become 300 sccm and conductance valve was adjusted so that pressure inside deposit chamber might become 1.0 Torr. Heater 405 was set to make temperature of substrate 404 200° C. and then SiH$_4$ gas, CH$_4$ gas and B$_2$H$_6$/H$_2$ gas were flowed into deposit chamber 401 after confirmation of substrate temperature stability. At this point of time, adjustment was made to obtain 15 sccm flow rate for SiH$_4$ gas, 2 sccm flow rate for CH$_4$ gas, 150 sccm flow rate for B$_2$H$_6$/H$_2$ gas, 150 sccm flow rate for H$_2$ gas and 1.0 Torr for internal pressure inside deposit chamber. Power of RF power supply was set at 0.01 W/cm$^3$ to introduce RF power to bias electrode 410, generate glow discharge, open shutter, start formation of RFp-type layer on substrate, close shutter after confirmation of 10 nm layer thickness of RFp-type layer deposited, stop glow discharge by switching RF power supply off and thus complete formation of RFp-type layer. Flow of $SiH_4$ gas, $CH_4$ gas and $B_2H_6/H_2$ gas into deposit chamber was stopped but flow of $H_2$ gas into deposit chamber was continued for 5 minutes. And then flow of $H_2$ gas into deposit chamber was also stopped for vacuum exhaust to obtain $1 \times 10^{-5}$ Torr in deposit chamber and gas pipes.

Then, before formation of MWp-type layer comprising $\mu$c-SiC, introduction of 500 sccm $H_2$ gas was done to obtain 0.02 Torr pressure inside deposit chamber and 200° C. temperature of substrate. After confirmation of substrate temperature stability, $SiH_4$ gas, $CH_4$ gas and $B_2H_6/H_2$ gas were flowed into deposit chamber. At this point of time, adjustment was made to obtain 5 sccm flow rate for $SiH_4$ gas, 1 sccm flow rate for $CH_4$ gas, 100 sccm flow rate for $H_2$, 400 sccm flow rate for $B_2H_6/H_2$ gas and 0.02 Torr for internal pressure inside deposit chamber. Then power of MW power supply (not shown) was set at 0.40 W/cm$^3$ to introduce MW power into deposit chamber through dielectric window for generation of glow discharge. Thus shutter 415 was opened and formation of MWp-type layer on RFp-type layer was started. Shutter 415 was closed, after confirmation of 10 nm layer thickness of MWp-type layer deposited, to stop glow discharge by switching MW power supply off and thus formation of MW p-type layer was completed. Flow of $SiH_4$ gas, $CH_4$ gas and $B_2H_6/H_2$ gas into deposit chamber was stopped but flow of $H_2$ gas into deposit chamber was continued for 5 minutes. And then flow of $H_2$ gas into deposit chamber was also stopped for vacuum exhaust to obtain $1 \times 10^{-5}$ Torr in deposit chamber and gas pipes. Auxiliary valve 408 was closed and leak valve 409 was opened to leak deposit chamber.

Next, as transparent electrode 308, ITO of 70 nm layer thickness was vacuum deposited on MWp-type layer.

Next, mask having comb-shaped hole was placed on the transparent electrode and the comb-shaped current collector electrode 309 comprising Cr (40 nm)/Ag (1,000 nm)/Cr (40 nm) was vacuum vapor deposited.

Now, production of solar cell was finished. Table 2 shows formation conditions of RFn-type layer, i-type layer, RFp-type layer and MWp-type layer of this solar cell. cell.

In this Experiment, solar cells were made by changing output of ultrasonic wave in the cleaning step. As cleaning bath, however, stainless steel container contacting π-type ferrite piezoelectric transducer was used. In the case of higher output experiment, output of each piezoelectric transducer was raised and at the same time the number of piezoelectric transducer installed was increased in accordance with requirement. Quantity of cleaning liquid was 100 liters in this experiment.

Comparative Experiment 1

The same substrate as that of Experiment 1 was cleaned by ultrasonic wave with acetone and isopropanol and was hot-air-dried by the cleaning method under conditions of Table 4 for comparison. Solar cell was produced on this substrate in the same way as Experiment 1.

Life of solar cell thus produced was measured after photodegradation test. At the photodegradation test, solar cell was placed under environment of 50% humidity and 25° C. temperature and was exposed to AM-1.5 (100 mW/cm$^2$) light for 500 hours.

Life of solar cell was measured by leakage current when −1 V was applied to the solar cell. Survival ratio of 100% was determined when leakage current was less than 20 $\mu$A, survival ratio of 50% was determined when leakage current was more than 20 $\mu$A and less than 500 $\mu$A and survival ratio of 0% was determined when leakage current was more than 500 $\mu$A. Average of 25 subcells of solar cell was calculated for survival ratio of the solar cell.

The results obtained concerning Experiment 1 and comparative Experiment 1 are shown in Table 3. As is apparent from Table 3, solar cell produced by production method of solar cell according to the present invention, gave good result concerning survival ratio after photodegradation test in the case output of ultrasonic wave at time of cleaning process lied in the range under 50,000 W.

Symbols in Table 3 show following survival ratio.

AA: more than 90% survival ratio

A: more than 70% but less than 90% survival ratio

B: more than 50% but less than 70% survival ratio

C: less than 50% survival ratio

Experiment 2

Surface pretreatment of the same substrate as that of Experiment 1 was made under the conditions shown in Table 5. Solar cell was produced on this substrate in the same way as that of Experiment 1. In this Experiment, solar cells produced by changing frequency of ultrasonic wave in cleaning process were evaluated in the same way as that of Experiment 1. The results thus obtained were shown in Table 6. As apparently shown in Table 6, solar cell produced by production method of solar cell according the present invention, gave good result concerning survival ratio after photodegradation test in the case frequency of ultrasonic wave at time of cleaning process lied in the range between 10 kHz and 10 MHz.

Experiment 3

Surface pretreatment of the same substrate as that of Experiment 1 was made under the conditions shown in Table 7. Solar cell was produced on this substrate in the same way as that of Experiment 1. In this Experiment, solar cells produced by changing water temperature of pure water contact process were evaluated in the same way as that of Experiment 1. The results thus obtained were shown in Table 8. For the reference, the evaluation results of solar cell produced by comparative Experiment 1 were also shown in Table 8.

As apparently shown in Table 8, solar cell produced by production method of solar cell in the present invention, gave good result concerning survival ratio after photodegradation test in the case water temperature of pure water contact process lied in the range between 5° C. and 90° C.

Experiment 4

Surface pretreatment of the same substrate as that of Experiment 1 was made under the conditions shown in Table 9. Solar cell was produced on this substrate in the same way as that of Experiment 1. In this Experiment, initial photoelectric conversion efficiency (photovoltaic power/incident light power) (referred to as conversion efficiency, hereafter) was measured concerning solar cells produced by changing quality (resistivity) of pure water used at time of pure water contact process were evaluated. Measurement of conversion efficiency was made by measuring V-I property placing solar cell produced under irradiation of artificial sun light with AM-1.5 (100 mW/cm$^2$) spectrum.

The same measurement was made concerning solar cell of comparative Experiment 1, also. Conversion efficiency ratio of this Experiment to comparative Experiment 1 was calculated for comparison of solar cell initial characteristics evaluation. Evaluation was made by using average of 10 solar cells produced under the same conditions. The results thus obtained were shown in Table 10.

Symbols in Table 10 show following conversion efficiency ratio.

AA: conversion efficiency ratio: more than 1.06.

A: conversion efficiency ratio: more than 1.02 but less than 1.06.

B: conversion efficiency ratio: more than 0.98 but less than 1.02.

C: conversion efficiency ratio: less than 0.98.

As apparently shown in Table 10, solar cell produced by production method of solar cell in the present invention, gave good result concerning conversion efficiency ratio in case resistivity of pure water used in pure water contact process is more than 11 MΩ·cm.

Experiment 5

Surface pretreatment of the same substrate as that of Experiment 1 was made under the conditions shown in Table 11. Solar cell was produced on this substrate in the same way as that of Experiment 1. In this Experiment, solar cell was produced by changing spraying pressure of pure water used at time of pure water contact process. Solar cell thus produced was evaluated in the same way as that of Experiment 4. The results obtained were shown in Table 12.

Evaluation was done by following criterion.

AA: conversion efficiency ratio: more than 1.06.

A: conversion efficiency ratio: more than 1.02 but less than 1.06.

B: conversion efficiency ratio: more than 0.98 but less than 1.02.

C: conversion efficiency ratio: less than 0.98.

As apparently shown in Table 10, solar cell produced by production method of solar cell in the present invention, gave good result concerning conversion efficiency ratio in case spraying pressure of pure water used in pure water contact process lied between 1 kgf/cm² and 300 kgf/cm².

Structure of the present invention was determined by above Experiments.

Following are examples for more detailed explanation of the present invention, which is not limited to these examples.

EXAMPLE 1

Figure 5:
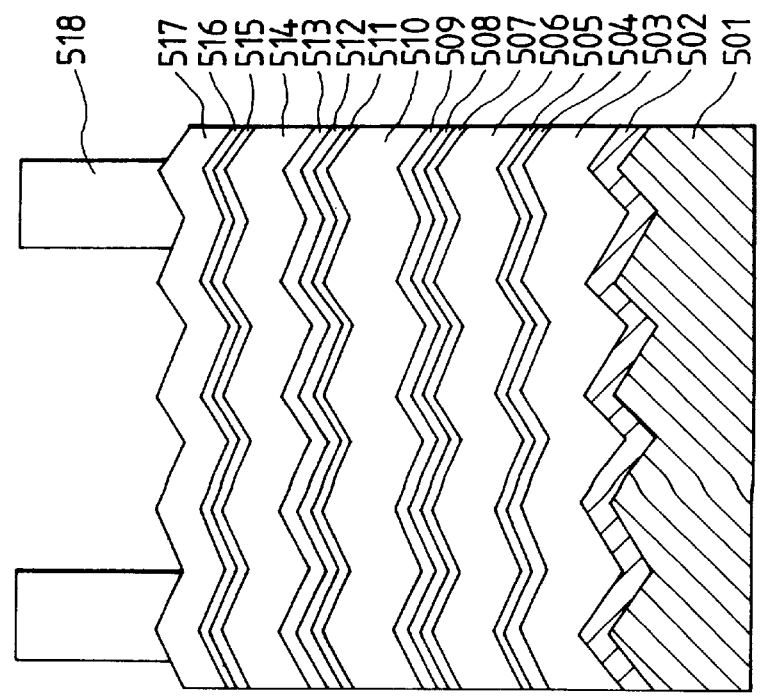
FIG. 5 is a schematic cross-sectional view illustrating constitution of a triple type solar cell.

Triple type solar cell shown in FIG. 5 was produced by using deposition apparatus of FIG. 4 employing MW PCVD method.

Surface pretreatment of stainless steel substrate 501 (SUS 304) of 50×50 mm² area was made under conditions shown in Table 13. Concentration of surfactant was 1 wt %.

By using sputtering method, Ag metal layer 502 of 0.3 μm layer thickness for light reflection was formed on the surface of stainless steel substrate 501. Then substrate temperature was set at 350° C. and substrate surface was made uneven (textured). ZnO reflection enhancing layer 503 of 2.0 μm layer thickness was formed on it at 350° C. substrate temperature.

At first, after preparation for film formation was completed in the same way as that of Experiment 1, 1st MWn-type layer 504 (μc-Si) was formed on the substrate pretreated in the same way as that of Experiment 1, and furthermore 1st RFn-type layer 505 (a-Si), 1st i-type layer thickness), 1st MWp-type layer 508 (μc-Si, 10 nm layer thickness), 2nd RFn-type layer 509 (μc-Si), 2nd i-type layer 510 (a-Si), 2nd RFp-type layer 511 (a-SiC, 10 nm layer thickness), 2nd MWp-type layer 512 (μc-SiC, 10 nm layer thickness), 3rd RFn-type layer 513 (a-SiC), 3rd i-type layer 514 (a-SiC), 3rd RFp-type layer 515 (a-SiC, 10 nm layer thickness) and 3rd MWp-type layer 516 (μc-SiC, 10 nm layer thickness) were formed in this order.

Then transparent electrode 517 and current collector electrode 518 were formed on 3rd MWp-type layer by vacuum vapor deposition method in the same way as that of Experiment 1.

Now, production of triple type solar cell (SC Ex. 1) was finished.

COMPARATIVE EXAMPLE 1

A triple type solar cell (SC Cp Ex. 1) was manufactured in the same condition as the Example 1, except the pretreatment of the substrate surface was as shown in Table 4.

The evaluation of the cell was made by the determination of conversion efficiency of the cell, and by the measurement of the survival ratio of the cell after the light degradation test. The determined conversion efficiency and survival ratio of the (SC Ex. 1) and (SC Cp Ex. 1) is shown in Table 14.

As shown in the table, it is concluded that the

As shown in the table, it is concluded that the solar cell of this invention (SC Ex. 1) has better characteristic than that of the comparative Example 1 (SC Cp Ex. 1).

EXAMPLE 2

Figure 6:
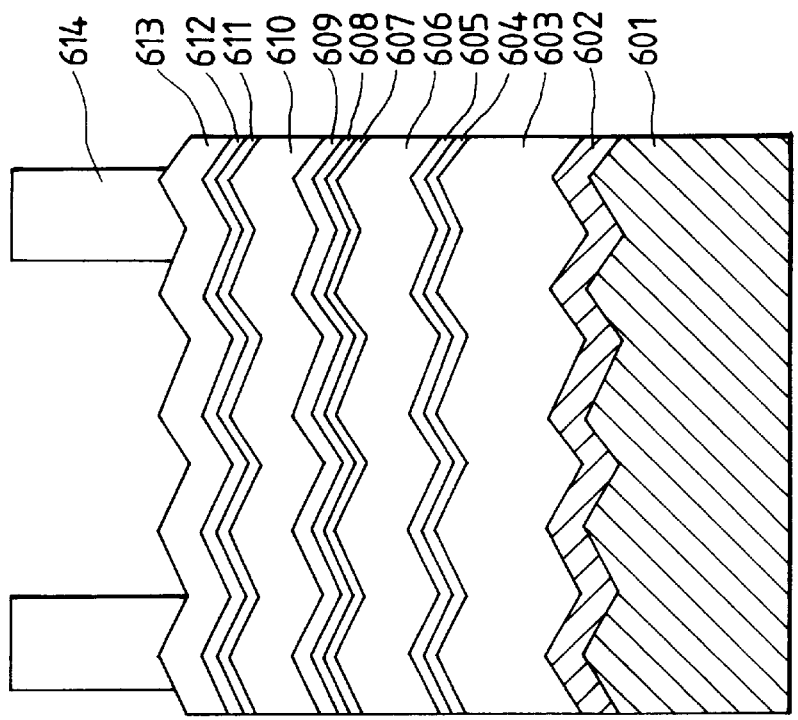
FIG. 6 is a schematic cross-sectional view illustrating constitution of a tandem type solar cell.

A tandem type solar cell shown in FIG. 6 was manufactured by the roll to roll method using the deposition apparatus shown in FIGS. 7A and 7B.

At first, a long stainless sheet (SUS 430) that has length 300 m, width 30 cm, thickness 0.1 mm, and mirror finishing of both sides, is used as the substrate 601. The surface of this substrate was cleaned by the cleaning device shown in FIG. 1, and by the condition shown in Table 15. Concentration of the surfactant was 1 wt %.

After that, the thickness 0.3 μm of Ag metallic layer 602 was continuously formed on the substrate 601, as the light-reflecting layer, at the substrate temperature of 350° C., and further, thickness 2.0 μm of ZnO layer was continuously formed on it, as the reflection enhancing layer 603, at the substrate temperature of 350° C. It was found that the finished surface has texture appearance.

FIGS. 7A and 7B are schematic drawings illustrating a continuous semiconductor layer formation apparatus by a roll-to-roll method. In this apparatus, a treated substrate feeding chamber 710, a plurality of deposition chambers 701–709, and a substrate takeup chamber 711 are located in this order. Among them, separation paths 712 are placed for respective connections. A long substrate 713 passes through them moving continuously from the substrate feeding chamber to the substrate takeup chamber; thereby the substrate is transported and respective semiconductor layers are simultaneously formed in each chamber with the transportation. Reference numeral 750 denotes a plan view observing from a top side of the deposition chambers; respective deposition chambers have an inlet 714 for the starting material gas and an outlet 715 for the spent gas; RF electrodes 716 or microwave applicators 717 are provided therein as required and halogen lamp heaters 718 are installed internally for heating the substrate. The starting material gas inlets 714 are connected to the starting material gas feeder (not shown). Respective deposition chambers have an outlet for the gas and are connected to vacuum evacuation pumps (not shown) such as an oil diffusion pump and mechanical booster pump. Respective RF electrodes are connected to the RF power sources and microwave applicators are connected to the MW power sources. The deposition chambers 703 and 707 for i-type layer have bias electrodes 731 and target electrodes 730, respectively having RF power sources. The separation paths have inlets 719 respectively for introducing the purge gas. The substrate feeding chamber is provided with a feeder roll 720 and a guide roll 721 that applies tension properly to the substrate and maintains the substrate horizontally. The substrate takeup chamber is provided with a takeup roll 722 and a guide roll 723.

First, the substrate mentioned above having formed light-reflecting layer and reflection enhancing layer is wound on to the substrate feeding roller 720, set to the substrate feeding chamber, allowed to pass through respective deposition chambers, and wound to the substrate takeup roll. The whole apparatus is evacuated into a vacuum by a vacuum pump not shown, the lamp heaters in respective deposition rooms are put into lightning and set so as to make the substrate temperature at respective chambers as predetermined. When the pressure of the whole apparatus becomes 1 m Torr or lower, $H_2$ gas is introduced through the purge gas inlet 719; and the substrate is moved in the direction of arrow and wound by the takeup roll.

Respective starting gases are introduced, as is the case of Example 1, into the respective deposition chambers while adjustment of the $H_2$ gas flow rate into each separation path and pressure of each deposition chamber being made so that the starting materials flowing into each deposition room should not diffuse to other deposition rooms. Then, glow discharge is generated by turning on the RF power, or MW power; thereby respective semiconductor layers are formed.

On the treated substrate, a first MWn-type layer 604 ($\mu$c-Si, thickness: 20 nm) is formed in the deposition chamber 701; a first RFn-type layer 605 (a-Si, thickness: 10 nm) in deposition chamber 702; a first i-type layer 606 (a-Si, thickness: 250 nm) in deposition chamber 703; a first RFp-type layer 607 (a-Si, thickness: 10 nm) in deposition chamber 704; a first MWp-type layer 608 ($\mu$c-Si, thickness: 10 nm) in deposition chamber 705; a second RFn-type layer 609 (a-SiC, thickness: 20 nm) in deposition chamber 706; a second i-type layer 610 (a-SiC, thickness: 200 nm) in deposition chamber 707; a second RFp-type layer 611 (a-SiC, thickness: 10 nm) in deposition chamber 708; and a second MWp-type layer 612 ($\mu$c-SiC, thickness: 10 nm) in deposition chamber 709 successively. When the transportation of the substrate finishes, all the MW and RF power sources are turned off stopping the glow discharge and the introduction of the starting material gas and purge gas is stopped. The whole apparatus was allowed to leak, and the wound substrate was removed.

Then transparent electrode 613, that is composed from ITO of layer thickness 70 nm, is continuously formed on the second MWp-type layer at the temperature 170° C. by spattering apparatus using the roll to roll method.

Next, a part of the substrate was cut out to the size of 50 mm×50 mm, and using the screen printing method, the collector electrode 614 was made by printing the carbon paste of layer thickness 5 $\mu$m, line width 0.5 mm and by printing silver paste of layer thickness 10 $\mu$m, line width 0.5 mm on it.

In the above mentioned process, the manufacture of the tandem type solar cell (SC Ex. 2) is finished.

COMPARATIVE EXAMPLE 2

A tandem type solar cell (SC Cp Ex. 2) by the roll to roll method is manufactured by the same way as described for the Example 2, except for that the pre-treatment was made according to the condition shown in Table 16.

The evaluation of the cell is made by the determination of conversion efficiency of the cell and by the measurement of the survival ratio of the cell after the light degradation test. The result of measurement on the conversion efficiency and survival ratio for (SC Ex. 2) and (SC Cp Ex. 2) is shown in the Table 17.

It is shown that the characteristic of the solar cell of this invention is much better than that of the comparative solar cell (SC Cp Ex. 2).

EXAMPLE 3

A tandem type solar cell (SC Cp Ex. 3) by the roll to roll method is manufactured by the same way as described for the Example 2, except for that the pre-treatment was made according to the condition shown in Table 18. However, the surfactant used in the washing process of this example was 1 wt % solution of dodecanole sulfuric acid ester sodium salt.

The same evaluation method as for the Example 2 was applied to this tandem type solar cell (SC Cp Ex. 3). This example also showed excellent characteristic same as Example 2.

EXAMPLE 4

The surface of a long stainless sheet substrate was pre-treated in the same way as for the Example 2, after that, the thickness 0.3 $\mu$m of AlSi layer was continuously formed on the substrate, as the light-reflecting layer, at the substrate temperature of 350° C., and further, thickness 2.0 $\mu$m of ZnO layer was continuously formed, as the reflection enhancing layer, at the substrate temperature of 350° C.

Except the above mentioned condition, a tandem type solar cell (SC Ex. 4) was manufactured by the roll to roll method in the same condition with the Example 2.

COMPARATIVE EXAMPLE 4

A tandem type solar cell (SC Cp Ex. 4) by the roll to roll method is manufactured by the same way as described for the Example 4, except for that the pre-treatment was made according to the condition shown in Table 16.

The evaluation of the resultant cell (SC Ex. 4) and (SC Cp Ex. 4) is made by the same way with the Example 2.

The result of measurement on the conversion efficiency and survival ratio after light degradation for (SC Ex. 2) and (SC Cp Ex. 2) are shown in the Table 20.

It is shown that the characteristic of the solar cell of this invention (SC Ex. 4) is much better than that of the comparative solar cell (SC Cp Ex. 4).

TABLE 1

| Treatment conditions | Cleaning step | Purified water contact step | Drying step |
| --- | --- | --- | --- |
| Treating agent | Purified water Surfactant | Purified water (Resistivity: | Air |

TABLE 1-continued

| Treatment conditions | Cleaning step | Purified water contact step | Drying step |
|---|---|---|---|
| | (polyethylene glycol nonylphenyl ether) | 15MΩ · cm) | |
| Temperature | 45° C. | 25° C. | 80° C. |
| Pressure | — | 50 kg · f/cm² | 50 kg · f/cm² |
| Treatment period | 3 minutes | 20 seconds | 1 minute |
| Ultrasonic wave output | Varied (Frequency: 60 kHz) | — | — |

TABLE 2

| | Gas flow rate (sccm) | | | | Pressure | MW power | RF power | Temperature | Film thickness |
|---|---|---|---|---|---|---|---|---|---|
| | SiH₄ | H₂ | PH₃/H₂ | B₂H₆/H₂ | CH₄ | (Torr) | (W/cm³) | (W/cm³) | (° C.) | ness (nm) |
| RFn | 2 | 100 | 200 | — | — | 1 | — | 0.02 | 350 | 20 |
| i | 150 | 150 | — | — | 30 | 0.01 | 0.20 | 0.32 | 350 | 200 |
| RFp | 15 | 150 | — | 150 | 2 | 1 | — | 0.01 | 200 | 10 |
| MWp | 5 | 100 | — | 400 | 1 | 0.02 | 0.40 | — | 200 | 10 |

TABLE 3

| Ultrasonic wave output(W) | Survival ratio |
|---|---|
| 0 | B |
| 100 | A |
| 1000 | AA |
| 10000 | AA |
| 50000 | A |
| 100000 | C |
| ComparativeExample | C |

TABLE 4

| Treatment conditions | Cleaning step | Drying step |
|---|---|---|
| Treating agent | Acetone Isopropyl alcohol | Air |
| Temperature | 50° C. | 110° C. |
| Treatment period | 10 minutes | 30 minutes |
| Ultrasonic wave output | 400 W (Frequency: 60 kHz) | — |

TABLE 5

| Treatment conditions | Cleaning step | Purified water contact step | Drying step |
|---|---|---|---|
| Treating agent | Purified water Surfactant (polyethylene glycol nonylphenyl ether) | Purified water (Resistivity: 15MΩ · cm) | Air |
| Temperature | 45° C. | 25° C. | 80° C. |
| Pressure | — | 50 kg · f/cm² | 50 kg · f/cm² |
| Treatment period | 3 minutes | 20 seconds | 1 minute |
| Ultrasonic wave output | 400 W (Frequency: varied) | — | — |

TABLE 6

| Ultrasonic wave frequency (kHz) | Survival ratio |
|---|---|
| 5 | C |
| 10 | B |
| 35 | A |
| 50 | AA |
| 200 | AA |
| 1000 | AA |
| 5000 | A |
| 10000 | B |
| 12000 | C |

TABLE 7

| Treatment conditions | Cleaning step | Purified water contact step | Drying step |
|---|---|---|---|
| Treating agent | Purified water Surfactant (polyethylene glycol nonylphenyl ether) | Purified water (Resistivity: 15MΩ · cm) | Air |
| Temperature | 45° C. | Varied | 80° C. |
| Pressure | — | 50 kg · f/cm² | 50 kg · f/cm² |
| Treatment period | 3 minutes | 20 seconds | 1 minute |
| Ultrasonic wave output | 400 W (Frequency: 60 kHz) | — | — |

TABLE 8

| Temperature (° C.) | Survival ratio |
|---|---|
| 0 | C |
| 5 | B |
| 7 | B |
| 10 | A |
| 12 | A |
| 15 | AA |
| 25 | AA |
| 40 | AA |
| 45 | A |
| 55 | A |
| 75 | B |
| 90 | B |
| 95 | C |
| ComparativeExperiment | C |

TABLE 9

| Treatment conditions | Cleaning step | Purified water contact step | Drying step |
|---|---|---|---|
| Treating agent | Purified water Surfactant (polyethylene glycol nonylphenyl ether) | Purified water (Resistivity: varied) | Air |
| Temperature | 45° C. | 25° C. | 80° C. |
| Pressure | — | 50 kg · f/cm² | 50 kg · f/cm² |
| Treatment period | 3 minutes | 20 seconds | 1 minute |
| Ultrasonic wave output | 400 W (Frequency: 60 kHz) | — | — |

TABLE 10

| Resistivity (MΩcm) | Conversion efficiency |
|---|---|
| 17.0 | AA |
| 15.0 | AA |
| 14.0 | A |
| 13.0 | A |
| 12.0 | B |
| 11.0 | B |
| 10.0 | C |

TABLE 11

| Treatment conditions | Cleaning step | Purified water contact step | Drying step |
|---|---|---|---|
| Treating agent | Purified water Surfactant (polyethylene glycol nonylphenyl ether) | Purified water (Resistivity: 15MΩ · cm) | Air |
| Temperature | 45° C. | 25° C. | 80° C. |
| Pressure | — | Varied | 5 kg · f/cm² |
| Treatment period | 3 minutes | 20 seconds | 1 minute |
| Ultrasonic wave output | 400 W (Frequency: 60 kHz) | — | — |

TABLE 12

| Water pressure (kg · f/cm²) | Conversion efficiency |
|---|---|
| 0 | C |
| 1 | B |
| 4 | B |
| 5 | A |
| 8 | A |
| 10 | AA |
| 50 | AA |
| 150 | AA |
| 170 | A |
| 200 | A |
| 230 | B |
| 300 | B |
| 350 | C |

TABLE 13

| Treatment conditions | Cleaning step | Purified water contact step | Drying step |
|---|---|---|---|
| Treating agent | Purified water Surfactant (polyethylene glycol nonylphenyl ether) | Purified water (Resistivity: 15MΩ · cm) | Air |
| Temperature | 45° C. | 25° C. | 80° C. |
| Pressure | — | 50 kg · f/cm² | 50 kg · f/cm² |
| Treatment period | 3 minutes | 20 seconds | 1 minute |
| Ultrasonic wave output | 400 W (Frequency: 60 kHz) | — | — |

TABLE 14

|  | (Sc Ex. 1) | (Sc Cp Ex. 1) |
|---|---|---|
| Conversion efficiency | 1.0 | 0.98 |
| Survival ratio | 1.0 | 0.90 |

TABLE 15

| Treatment conditions | Cleaning step | Purified water contact step | Drying step |
|---|---|---|---|
| Treating agent | Purified water Surfactant (polyethylene glycol nonylphenyl ether) | Purified water (Resistivity: 15MΩ · cm) | Air |
| Temperature | 45° C. | 25° C. | 80° C. |
| Pressure | — | 50 kg · f/cm² | 5 kg · f/cm² |

TABLE 15-continued

| Treatment conditions | Cleaning step | Purified water contact step | Drying step |
|---|---|---|---|
| Treatment period | 3 minutes | 20 seconds | 1 minute |
| Ultrasonic wave output | 400 W (Frequency: 60 kHz) | — | — |

TABLE 16

| Treatment conditions | Cleaning step | Drying step |
|---|---|---|
| Treating agent | Purified water | Air |
| Temperature | 25° C. | 80° C. |
| Pressure | — | 5 kg · f/cm$^2$ |
| Treatment period | 3 minutes | 1 minute |
| Ultrasonic wave output | 400 W (Frequency:60 kHz) | — |

TABLE 17

|  | (Sc Ex. 2) | (Sc Cp Ex. 2) |
|---|---|---|
| Conversion efficiency | 1.0 | 0.90 |
| Survival ratio | 1.0 | 0.80 |

TABLE 18

| Treatment conditions | Cleaning step | Purified water contact step | Drying step |
|---|---|---|---|
| Treating agent | Purified water Surfactant (sodium salt of dodecanol sulfuric acid ester) | Purified water (Resistivity: 15 MΩ · cm) | Air |
| Temperature | 45° C. | 25° C. | 80° C. |
| Pressure | — | 50 kg · f/cm$^2$ | 5 kg · f/cm$^2$ |
| Treatment period | 3 minutes | 20 seconds | 1 minute |
| Ultrasonic wave output | 400 W (Frequency: 200 kHz) | — | — |

TABLE 19

|  | (Sc Ex. 2) | (Sc Cp Ex. 2) |
|---|---|---|
| Conversion efficiency | 1.0 | 0.90 |
| Survival ratio | 1.0 | 0.80 |

TABLE 20

|  | (Sc Ex. 4) | (Sc Cp Ex. 4) |
|---|---|---|
| Conversion efficiency | 1.0 | 0.90 |
| Survival ratio | 1.0 | 0.80 |

According to the present invention, it becomes possible to offer the manufacturing method to provide the photoelectric transducer that has high conversion efficiency and long durability period.

Further the present invention offers the manufacturing method to produce large area of photoelectric transducer that is strong to bending distortion, and is excellent in its uniformity.

Also, the present invention provides the manufacturing method to produce high performance photoelectric transducer that does not use organic solvent in its manufacturing process; accordingly the method should be excellently environment-friendly.

Further this invention can offer the manufacturing method that is suitable for mass production of the photoelectric transducer, and that is excellent in the manufacturing cost.

What is claimed is:

1. A method of manufacturing a photoelectric transducer for obtaining photoelectromotive force on a conductive substrate having an electrically conductive surface, comprising the steps of:

transferring the conductive substrate to immerse a part of the conductive substrate in a cleaning liquid containing water, and applying an ultrasonic wave to the cleaning liquid, thereby conducting ultrasonic cleaning;

contacting the surface of the substrate with purified water after the ultrasonic cleaning and before drying of the substrate, the contact with the purified water being effected by spraying the purified water onto the substrate, said transferring step and said contacting step being performed in such manner as to impart to the surface a uniform oxidation; and drying the conductive substrate contacted with the purified water, then forming on the surface of the substrate an electrically conductive film and then a semiconductive layer.

2. The method according to claim 1, wherein the electrically conductive film comprises a metal layer which functions as a light-reflecting layer.

3. The method according to claim 1, which further comprises a reflection enhancing layer between the electrically conductive film and the semiconductor layer.

4. The method according to claim 2, wherein the semiconductor layer comprises a non-monocrystalline material comprising silicon as a matrix.

5. The method according to claim 2, wherein the semiconductor layer is formed by a plasma chemical vapor deposition method.

6. The method according to claim 2, wherein the semiconductor layer comprises a p-type semiconductor layer and an n-type semiconductor layer.

7. The method according to claim 6, which further comprises an i-type semiconductor layer between the p-type semiconductor layer and the n-type semiconductor layer.

8. The method according to claim 1, which further comprises an electrode layer on the semiconductor layer.

9. The method according to claim 8, wherein the electrode layer comprises a transparent electrode.

10. The method according to claim 1, wherein the cleaning liquid contains a surfactant.

11. The method according to claim 1, wherein the frequency of the ultrasonic cleaning is 10 kHz to 10 MHz.

12. The method according to claim 1, wherein the specific resistivity of the purified water is 11 MΩ·cm to 18.2 MΩ·cm.

13. The method according to claim 1, wherein at least the surface of the conductive substrate comprises stainless steel.

14. The method according to claim 1, wherein the surface of the conductive substrate comprises a ferritic stainless steel containing at least chromium.

15. The method according to claim 14, wherein the chromium is contained in an amount of about 18%.

16. The method according to claim 1, wherein the surface of the conductive substrate comprises an austenitic stainless steel containing at least chromium and nickel.

17. The method according to claim 16, wherein the chromium is contained in an amount of about 18% and the nickel is contained in an amount of about 8%.

18. The method according to claim 1, wherein the conductive film is a reflective layer.

19. The method according to claim 1, wherein the conductive film is a metal material.

20. The method according to claim 1, wherein the conductive film is a metal selected from the group consisting of silver, aluminum silicide, aluminum and copper.

21. The method according to claim 3, wherein the reflection enhancing layer comprises $ZnO$, $SnO_3$, $In_2O_3$, Indium Tin Oxide, $TiO_2$, $CdO$, $Cd_2SnO_4$, $Bi_2O_3$, $MoO_3$ or $Na_xWO_3$.

22. The method according to claim 1, wherein the spraying is conducted by pressurizing the purified water.

23. The method according to claim 22, wherein the pressure is 1 to 300 kg·f/cm$^2$.

24. The method according to claim 1, wherein the purified water is contacted at a flow rate of 1 liter per minute to 200 liters per minute.

25. The method according to claim 1, where the spraying is conducted by spraying the purified water under air pressure.

26. The method according to claim 1, wherein the substrate cleaning is conducted while transferring the substrate.

27. The method according to claim 1, wherein the substrate cleaning is conducted while transferring the substrate intermittently.

28. The method according to claim 1, wherein the purified water being sprayed onto the substrate has a motional component in a direction opposite to a direction in which the conductive substrate is transferred in said transferring step.

29. A method according to claim 1, wherein the purified water is sprayed onto the substrate at an angle of 10 to 80 degrees in relation to the surface of the substrate.

* * * * *

UNITED STATES PATENT AND TRADEMARK OFFICE
CERTIFICATE OF CORRECTION

PATENT NO. : 6,132,817
DATED : October 17, 2000
INVENTOR(S) : Nobuo Tokutake et al.

It is certified that error appears in the above-identified patent and that said Letters Patent is hereby corrected as shown below:

Title page,
Item [56] References Cited, under FOREIGN PATENT DOCUMENTS, "3283429" should read -- 3-283429 --; and "5158257" should read -- 5-158257 --;

Column 1,
Line 15, "as," should read -- as a --; and
Line 16, "and," should read -- and as --.

Column 2,
Line 2, "the" (first occurrence) should read -- that the --; and
Line 19, "atom" should read -- atoms --.

Column 4,
Line 40, "factors the," should read -- factor, the --.

Column 9,
Line 66, "Conductivity" should read -- conductivity --.

Column 10,
Line 5, "invention" should read -- invention) --.

Column 11,
Line 14, "$B_4H_9$, $B_5H_9$, $B_6H_{10}$," should read -- $B_4H_{10}$, $B_5H_9$, $B_5H_{11}$, --.

Column 18,
Line 27, line 27 should be deleted.

Column 20,
Line 4, "for" should be deleted.

Column 21,
Table 1, "50 kg · f/cm$^2$" should read -- 5 kg · f/cm$^2$ --.

Column 22,
Tables 5 and 7, "50 kg · f/cm$^2$" should read -- 5 kg · f/cm$^2$ --.

UNITED STATES PATENT AND TRADEMARK OFFICE
CERTIFICATE OF CORRECTION

PATENT NO. : 6,132,817
DATED : October 17, 2000
INVENTOR(S) : Nobuo Tokutake et al.

It is certified that error appears in the above-identified patent and that said Letters Patent is hereby corrected as shown below:

Column 23,
Table 9, "50 kg · f/cm$^2$" should read -- 5 kg · f/cm$^2$ --.

Column 24,
Table 13, "50 kg · f /cm$^2$" should read -- 5 kg ·f /cm$^2$ --.

Column 28,
Line 4, "met hod" should read -- method --.

Signed and Sealed this

Second Day of April, 2002

Attest:

JAMES E. ROGAN
*Attesting Officer*  *Director of the United States Patent and Trademark Office*